United States Patent [19]
Christensen, Sr.

[11] 4,213,192
[45] Jul. 15, 1980

[54] ELECTRON BEAM ACCESSED READ-WRITE-ERASE RANDOM ACCESS MEMORY

[76] Inventor: Alton O. Christensen, Sr., 3455 Homestead Rd. #47, Santa Clara, Calif. 95051

[21] Appl. No.: 3,501

[22] Filed: Jan. 15, 1979

Related U.S. Application Data

[63] Continuation of Ser. No. 761,922, Jan. 24, 1977, abandoned.

[51] Int. Cl.² ............... G11C 11/21; G11C 11/23
[52] U.S. Cl. ................................................ 365/118
[58] Field of Search ..................... 365/118, 217, 237

[56] References Cited

U.S. PATENT DOCUMENTS

| | | | |
|---|---|---|---|
| 3,736,571 | 5/1973 | Cohen et al. | 365/118 |
| 3,761,895 | 9/1973 | Ellis et al. | 365/118 |
| 3,886,530 | 5/1975 | Huber et al. | 365/118 |
| 3,950,738 | 4/1976 | Hayashi et al. | 365/185 |
| 4,010,482 | 3/1977 | Abbas et al. | 357/15 |

*Primary Examiner*—Stuart N. Hecker
*Attorney, Agent, or Firm*—Gunn and Lee

[57] ABSTRACT

An electron beam storage device is disclosed. A beam impinges on a target. The target stores data and it can be read as needed. The target is made of multiple layers, from the top, a first layer of thin conductive metal, and a semiconductor joined to it to define a Schottky diode. The beam liberates ionized pairs in the semiconductor. This is joined to an adjacent layer of dielectric and there is another layer of dielectric. The charge in the semiconductor causes tunneling across the first dielectric into the second where it is held. A bottom layer of metal serves as a gate and terminal for bias voltages. The beam is directed to selected X-Y locations to store data, and read in the same manner.

27 Claims, 12 Drawing Figures

ELECTRON BEAM ACCESSED READ-WRITE-ERASE RANDOM ACCESS MEMORY

This is a continuation of application Ser. No. 761,992, filed Jan. 24, 1977, now abandoned.

BACKGROUND OF THE INVENTION

This apparatus is directed to an electron beam accessed random access memory which is capable of reading, writing and erasing information stored in a binary state. Such devices already appear in the literature. One such device is described by literature of the General Electric Company. Another such device is described in *Applied Physics Letters*, Volume 16, No. 147, (1970) by Hunert et al. That device and the one described by the General Electric Company have met with a measured degree of success. Nevertheless, the electron beam subjects the metal-oxide-semiconductor (MOS) memory dielectric layer in both devices to an excessive fluence of electrons over a period of time damaging the dielectric layer and destroying the ability of the MOS memory target to both store information and to read stored information. Over a period of time, obviously depending upon the electron beam current and the repetition of read and write cycles, the integral of the electron beam fluence ultimately produces an ionizing radiation damage in the silicon dioxide dielectric layer, causing physical damage to that layer evidenced in a saturation of positive charge which prohibits further reading, writing and erasing of information. Thus, the memory target life cycle of both prior art devices is severely limited.

The lifetime of data stored in the prior art devices is limited in that the charge stored in the silicon dioxide layer of the MOS target, prior to radiation damage, is volatile in that charges also accumulate during reading operations so that after a few readings, data storage is no longer distinguishable as a binary state, and must be erased and written again.

In addition the devices of the prior are somewhat limited in the number of bit storage locations per unit area. In the prior art devices, relatively thick layers of the MOS target must be penetrated by a highly accelerated electron beam, and therefore some scattering of the beam is produced as it traverses or penetrates into each successive target layer. Such scattering enlarges the definable storage area to an area larger than the optimum and results in the relative loose packing density of bit locations in a grid pattern organized on a semiconductor target used with an accelerating electron beam source of the sort taught heretofore. As a consequence, the packing density has been rather low and the useful life time has been shortened for the reasons mentioned above. This results in a device which is rather large and uneconomic to use in comparison with memory devices operative on entirely different techniques.

Furthermore, the source of electrons in the prior art devices are structures such as those used in Cathode Ray Tubes (CRT), with the result that the physical size and power requirement of the prior art devices are like that of a five inch CRT.

Also, the prior art devices are limited by the single CRT-like electron source, focus and beam deflection system to define a single information bit per access yielding a serial stream of bits. This sacrifices inherent speed and economy of multiple bit, parallel byte or word per access operation in reading, writing and erasing.

Also, the prior art requires about 18 times the electron beam current for operation, resulting in 350 times the electron beam power requirement.

In addition, the physical size and high vacuum requirement of the prior art (CRT-like equipment) limit the effective lifetime of the electron beam source, resulting in less economy of operation and periodic premature replacement.

Also, the prior art requires manufacturing steps which do not allow the economies of semiconductor-type batch manufacturing processes used to manufacture the present invention.

The devices of the prior art are further deficient in that they customarily use a junction diode as the output device. While the junction diode has a suitable diode gain, it is not anywhere near that attained by the electron beam penetration into a Schottky diode of the present device which has at least twice the gain. Accordingly, the output signal from this device is much larger and is easier to work with. This improves the accuracy of the data obtained from the memory device disclosed herein.

Furthermore, the prior art devices do not allow selective erase or overwrite of stored data of both polarities, and they must consequently resort to bulk or total erase of an entire storage array in order to erase previously written data, resulting in slow operation and higher cost of operation. The present invention allows selective overwrite or erase at the same rate as a normal reading cycle.

In comparison with semiconductor or core type random access memories, the cycle-time of the present invention is nearer the access time, and not large multiples of the access time thereby allowing greater speed and economy of operation.

Thus, the beam accessed storage devices of the prior art are capable of only a few reading and writing cycles and have a storage life shorter than other memories commercially acceptable, have less than optimum storage density, cannot selectively overwrite or erase data stored both polarities, are of large physical size, require much higher power for operation, produce only a single bit per random access and require multiple devices at multiplied power and space for parallel bit access, cannot be manufactured by economic semiconductor-type batch processes, resulting in limited utility and economy of operation.

SUMMARY OF THE DISCLOSURE

The present invention is an electron beam accessed random access memory. Data storage sites are delineated only by repeatable beam position within an X and Y coordinate set of N by N addresses, and not by photolithographic techniques. The present invention is comprised of an array of field emission microcathodes which are individual sources of electrons, an array of focusing electrodes, an array of X-Y deflection electrodes, and an array of memory target areas. Each microcathode cooperates with its designated target. Each array is suitable for manufacture by semiconductor-type batch manufacturing processes.

The electron beam current from each microcathode is controlled by a read/write control voltage, and is timely modulated during writing by a binary data waveform voltage. Each microcathode is individually focused by a voltage connected in common to all focus electrodes. Each beam of electrons is deflected by orthogonal deflection electrode pairs by a potential in common with like axis pairs of each electron beam. The potentials are the analog conversion of digital address inputs and provide precise positioning within an N by N matrix of stored data addresses in a target.

The electron beam is accelerated by a potential applied between the microcathode and the memory target, a common single potential for all electron beams. The memory target is comprised of five layers: the first is a thin layer of metal conductor and the second is a thin layer of semiconductor which together form a Schottky diode; the third is a thin layer of dielectric, the fourth is a second thicker dielectric layer, and the fifth layer is a thicker metal layer, which is the gate terminal of the memory target. The accelerated electron beam penetrates into the silicon layer and stops short of the thin dielectric layer. In writing, a larger electron beam current is applied than in reading. The writing current causes a field potential to be produced which is polarized and augmented by a voltage applied to the gate terminal. The field causes charges of polarity opposite to the polarity of the gate to semiconductor voltage to tunnel through the thin dielectric which are captured near the dielectric interface. The polarity of the captured charges affects the surface recombination velocity of the carriers created by the reading beam such that the current across the metal semiconductor Schottky diode is modulated by the polarity of captured charges. That current is amplified and appears as the output stored data waveform. As many storage areas as desired of the M by M memory target arrays may be read at the same time, allowing fast highly parallel reading and writing. Erasing of data is accomplished by overwriting individual storage areas, or in bulk by application of a significantly higher potential to the storage area gate. The dielectric layers are never irradiated by the electron beam and therefore no radiation damage occurs. The electron beam current, less than one nanoampere, is insufficient to cause any damage to the silicon.

The thin dielectric layer is sufficiently thick to prevent data loss from the thicker dielectric layer by thermal tunneling of captured charges. The reading electron beam current is insufficient to create the field necessary for tunneling of charges through the thin dielectric. Therefore, the life of the stored charges is very long, up to 15 years, or until purposely erased.

The microcathode, focus, deflection and memory target arrays are assembled into a suitable evacuated enclosure only a fraction of a cubic inch in volume, and have an estimated operating life at an average vacuum of $10^{-5}$ torr of over 7 years.

DESCRIPTION OF THE PREFERRED EMBODIMENT

The preferred embodiment of the present apparatus employs an array of M by M field emission cold cathodes to generate M by M electron beams, each of which is focused and then deflected by its respective lense and X-Y axis deflection plates in an M by M array of focus and deflection elements. The produced, focused and deflected M by M array of electron beams are individually accelerated by a common accelerating potential toward a respective memory target of an M by M array of targets. Each beam is positioned to one of N by N positions in its respective target by X and Y axis deflection voltages applied in common to the M by M array of X and Y deflection plates for the reading, writing or erasing of M by M bits of information per N by N positions. No other delineation of bit storage area other than beam position is required. The total storage capacity is thus $M \times M \times N \times N$ bits. A square arrangement is preferable although some other arrangement may be used.

Each functioning element of the present apparatus, field emission cathode array, focus array, deflection array and memory target array, is devised such that it is produceable in batch quantities by semiconductor-type manufacturing techniques to obtain maximum economy of manufacture. Those elements are then assembled into and operated in an evacuated enclosure such as a hermetically sealed housing.

Each field emission cold cathode forms a beam of electrons which is modulated by a suitable data waveform when writing and each produces a steady state beam when reading. One current level is used for writing and a smaller current is used in reading. Each beam of electrons is then focused through the operation of a limiting aperture as a part of a simple immersion lense system. In the preferred embodiment, the limiting aperture and immersion lense are formed by suitably patterned conductive layers separated by an insulating layer through which layers a transverse hole is formed for the electron beam to traverse. The focused electron beam is accelerated by the application of a potential from cathode to memory target of about 4000 to 6000 volts to also pass through its respective set of X-Y deflection plates. In the preferred embodiment, the X-Y deflection pairs are each formed in pairs by suitably patterned conductive layers with the X pair separated from the Y pair by a suitable insulating layer. The X and Y pairs are arranged in orthogonal relationship adjacent to the transverse hole formed in the layers through which the electron beam traverses. In practice M+1 patterned conductors are used for each axis deflection plates with alternate conductors for each axis connected to the same polarity of the deflection voltage source for that axis, such that except for the first and the Mth deflection conductors, all others use as its conductor pair one conductor in common with it neighbor on either side such that the direction of deflection for each is opposite from that of its neighbor in one axis of deflection.

The target into which the focused and deflected M by M array of electron beams is accelerated in an M by M array of storage areas formed of five layers, one of metal, one semiconductor layer, two successive layers of differing dielectrics, and a metal layer. That (MSDDM) layered M by M array performs the memory storage function with one MSDDM area allocated for each electron beam.

Within the target MSDDM layers, the layer which is first traversed by the electron beams is a thin metal conductive layer approximately 25 nanometers in thickness which is in Schottky contact with the second or semiconductor layer. The preferred metal is aluminum and the preferred semiconductor is N doped silicon, however, other metal-semiconductor systems could be used that form Schottky contacts. The semiconductor layer into which the electron beam penetrates is suitable doped. In the preferred embodiment, the silicon semiconductor is doped in an N-type dopant to a low resistivity. The dopant concentration should not be sufficient to cause either tunneling of carriers across the Schottky depletion region, nor to allow breakdown of the Schottky metal-semiconductor contact diode when operating under reverse bias conditions. A suitable connection is made to the semiconductor and to the metal by a pair of terminals and a suitable voltage is applied of polarity opposite to the conduction direction of the Schottky diode. The applied voltage extends the depth of the diode depletion region into the semiconductor in a manner which is well documented in standard texts on semiconductor physics. The depth of penetration of the beams of electrons is a function of the accelerating voltage applied across the electron beam source-to-target system and is adjusted in operation such that the beam of electrons is not accelerated into the dielectric layers.

As the accelerated beam loses its energy in the semiconductor layer, that energy loss exites many valence band electrons into the conduction band and thereby generates electron-holes pairs in the region of the beam penetration. In silicon, an electron-hole pair is created in the mean by each 3.6 electron-volts of beam energy thus transformed.

According to Poisson's equation, as detailed in standard texts on semiconductor physics, carriers with a current density of magnitude j will cause an electric field $E(j,x)$ to occur in a semiconductor a distance x from the surface. In the writing operation, that field is used to cause carriers to tunnel through the first thin dielectric layer into capture in the second dielectric layer. The current density is given by the electron beam current multiplied by the ratio of the electron acceleration energy expended in the semiconductor (Ea) to the ionizing energy of the semiconduct or (Ei) for silicon is 3.6 ev. Thus j is proportional to $Ib(Ea/Ei)$ where Ib is the beam current. As detailed by Svensson and Lundstrom in the *Journal of Applied Physics*, Vol. 44, No. 10, 4657f, October 1973, the field required for tunneling into the second dielectric is a function of the speed of tunneling required and the thickness of the first dielectric, and differs slightly for the tunneling of holes as compared to the tunneling of electrons. Typically the field required is in the order of $10^7$ volts per centimeter for tunneling to occur at speeds in the order of a few tens of nanoseconds. A portion of the field is supplied by the gate to semiconductor potential applied, and the polarity of the potential determines which polarity charges will be caused to tunnel, either electrons for a positive gate-to-semiconductor, potential or holes for a negative gate-to-semiconductor potential. If electrons are tunneled and then captured in the second dielectric, then, for an N-type semiconductor, the surface recombination velocity will tend to increase. If holes are tunneled and captured, then the surface recombination velocity tends to decrease. The tunneling of holes would tend to erase previously tunneled electrons, and vice versa, such that previously written data can be overwritten or rewritten, selectively without a prior or separate erase operation.

For writing, the beam current is significantly greater than in a reading operation. The width of the Schottky diode depletion region is adjusted by the bias potential to prevent tunneling across the diode and to withstand the electron beam injected field. The beam accelerating voltage is held constant for both writing and reading at a level such that the electron beam penetration falls short of the semiconductor dielectric interface, and in writing, well beyond the semiconductor edge of the Schottky depletion region to limit the number of electron beam created charges captured by the field of the Schottky diode. As given by Ellis, Poisson and Wilson in the *Applied Physics Letters*, Vol. 24, No. 9, p. 420, May 1974, the probability P of a carrier being captured by the field of the Schottky diode is approximately $$P = (1 + (S/D)x)/(1 + (S/D)d) \quad (1)$$

S = Surface recombination velocity
D = diffusion constant
x = distance the carrier is created from the dielectric-semiconductor interface
d = distance of the Schottky diode from that interface.

Thus, if x is made small as compared to d, the probability of capture by the diode is small, as is the case in the writing mode.

The surface recombination velocity is altered by the charges tunneled into the dielectric-dielectric interface and by the energy states of charges existing at the semiconductor-dielectric interface as a result of unsaturated lattice bonds or as the result of imperfections or impurities customarily found at the surface. In the prior art, the result of irradiation through the dielectric is shown by Ma, *Applied Physics Letters*, Vol. 27, No. 11, p. 615f, December 1975, to produce permanent additional broken or unsatisfied bonds and therefore a permanent large fixed positive charge at the semiconductor surface, which accounts for the short life of the prior art devices. The normal energy states, called fast surface states, can be made to exist with densities greater than $10^{10}$ per square centimeter. Those fast states act as surface recombination centers and control the recombination and generation of carriers within a few diffusion lengths of the surface. The surface recombination velocity S is a measure of the activity of those states in recombining electron-hole pairs at the surface, producing a particle current $J/q$ proportional to the excess of minority carriers at the surface dN, such that $$S = (J/q)/dN \quad (1)$$

where q is the electron charge. S is a maximum when the surface is in flatband condition, and a minimum when the surface is heavily inverted or heavily accumulated. In the preferred embodiment, operation is between heavy accumulation, where S approaches zero, and flatband, where S approaches $10^6$. The effect of charges trapped near the dielectric-dielectric interface is to change the surface potential and therefore change S. Note that, according to equation (1) above that as S approaches zero, the probability of carrier capture by the diode field approaches unity, and the diode output current approaches a maximum.

The distance of the trapped charges from the semiconductor-dielectric interface also alters the surface potential; the nearer the charge centroid, the greater the effect. In the preferred embodiment, the trapped charges are significantly nearer the interface, by a factor of three or more, than that of the prior art as detailed by Ning, p. 1078 and by Woods and Williams, p. 1082, both in the *Journal of Applied Physics*, Vol. 47, No. 3, March 1976. The articles establish that in the prior art the centroid of charges trapped in silicon dioxide is about 20 nanometers from the silicon interface. Arnett and Yun, *Applied Physics Letters*, Vol. 26, No. 3, February 1975 p. 94f, determined that the centroid of charges tunneled into silicon nitride through a thin silicon dioxide was 5.5 nanometers from the silicon interface. That 5.5 nanometer distance of charge centroid has 20/5.5 or 3.6 times the effect on the surface recombination velocity as compared to the prior art. Or, consequently, the electron beam current requirement can be reduced by 72.5 percent for the same effect on the surface recombination velocity, thus reducing the power dissipation by an order of magnitude, as compared to the prior art, from this consideration alone.

In both the prior art and in this invention, electrons of the writing beam create charged pairs according to the ratio of the energy surrendered Ea, to the ionizing potential, Ei, of their respective materials. In the prior art the material is silicon dioxide with Ei=19.7 ev, and in the present invention the preferred material is silicon where Ei=3.6 ev. Thus, the number of charges generated by the present invention electrons with a constant Ea for comparison is 17.7/3.6 or 5.2 times as many as the prior art device. Without considering the minimum two fold advantage of the present invention's ability to store charges of both polarities, the prior art requires 3.6×5.2 or more than 18 times the beam current to have equivalent effect on the surface recombination velocity, and also increases the power requirement by 350 times as compared to the present invention.

In writing, the fields produced by the beam of electrons in the silicon is polarized by the voltage applied between the gate layer and silicon layer terminals. The electron beam current controls the magnitude of the field between the silicon, and the silicon-to-gate voltage controls the polarity of stored charge and contributes to the field magnitude. The polarity of the silicon-gate field separates the ionized charges created by the electron beam in the silicon semiconductor. The magnitude of the field produced by the writing electron beam current is sufficient, about $10^7$ V/cm, across the thin silicon dioxide dielectric to cause charges to tunnel into the second dielectric to be captured near the interface. Charges of opposite sign to that of the gate potential are accelerated by the gate-semiconductor potential toward the gate to first recombine at the dielectric-semiconductor interface with surface charges of opposite polarity, if present, to reduce the surface charge and thereby enhance the field required for and the probability of tunneling across the thin dielectric. Secondly, charges tunnel across the thin dielectric to combine with such pre-existent charges of opposite polarity, which may include those which were previously written, at the dielectric-dielectric interface, and are captured near that interface. When sufficient recombination and capture has occurred, the field across the thin dielectric is diminished and the number of charges tunneling to the interface is decreased. DiStefano and Shatzkes, *J. Vac. Sci. Technol.*, Vol. 13, No. 1, 1976, p. 50f, have determined that thin layers of silicon dioxide, as in the present invention can withstand a much greater field than dielectrics thicker than 30 nanometers, and further established that the ultimate potential supportable across a very thin dielectric of less than 4 nanometers is 12 volts. The present invention for four megabits per second writing speeds requires 2.5 volts across a 2.5 nanometer dielectric layer for high probability of tunneling at that rate of writing.

The present invention, in providing the capability to tunnel and capture charges of either polarity at the dielectric-dielectric interface in the writing of digital data, produces a significantly greater variation in the reading surface recombination velocity than achievable heretofore. That capability results in a significant increase in the Schottky diode current difference in reading binary stored data. The silicon-dielectric surface condition is varied between heavy accumulation (erase or stored binary "0") to near flat-band condition (stored binary "1")-resulting in surface recombination velocities of near $10^2$ cm/sec to near $10^6$ cm/sec, respectively, a difference of approximately four orders of magnitude. Since the diffusion coefficient D in equation (1) can be made less than 10 square cm/sec for holes in low resistivity N-type silicon, the diode current variations proportional to the probability of read-generated-carrier capture can be made to vary over a wide range to differentiate between stored binary "1" and binary "0".

The reading electron beam current required for 1 error in $10^{12}$ is given by Hughes, et al, in *Proc. IEEE*, Aug. 1975, p. 1238:

$$I = \frac{S/N(BCE)}{\sqrt{3} \, dG}$$

where:
 I is the required electron beam current for S/N=23 db
 B is the reading rate in bits per second
 C is the capacitance of the diode depletion region
 dG is the achievable diode gain
 E is the RMS amplifier noise voltage referred to its input.

The electron beam current required according to the above equation for the present invention at a reading bit rate of $10^7$ per second is typically 5 picoamperes.

Because the diode current variation during reading is partly a function of whether or not carriers recombine at the surface, and the surface condition is varied by writing data from a heavy accumulation condition to near flat band condition, the recombination at the surface with charges captured near the dielectric-dielectric interface defines the worst-case storage condition. The longevity of storage is a function of the number of times a storage area can be read until the recombination at the surface produces a sufficient reverse field across the thin dielectric to cause back tunneling of charges captured at the dielectric-dielectric interface. Such a field requires in excess of 0.6 volts from the charge centroid to surface interface according to the data of Maes and Overstraeten, *Journal of Applied Physics* V. 47, No. 2, 1976, 664–665. At normal reading speeds of four megabits per second and above, the creation of such a potential and the probability of tunneling would require hundreds of thousands of consequitive readings of the same bit of data to produce a reading error, an occurrence with near zero probability in normal computer memory usage and programming techniques.

The microcathode electron beam sources appear to be a major source of failure of the device of the present invention. Brodie, in the *Int. Journal of Electronics*, v. 38, No. 4, pp. 541–550, develops the equation for lifetime of microcathodes. Substituting into Brodie's equation selected values for the preferred embodiment, and using $10^{-5}$ torr as the average vacuum, produces an average lifetime of a microcathode array in excess of 10 years.

THE ASSEMBLY AS A UNIT

Figure 1:
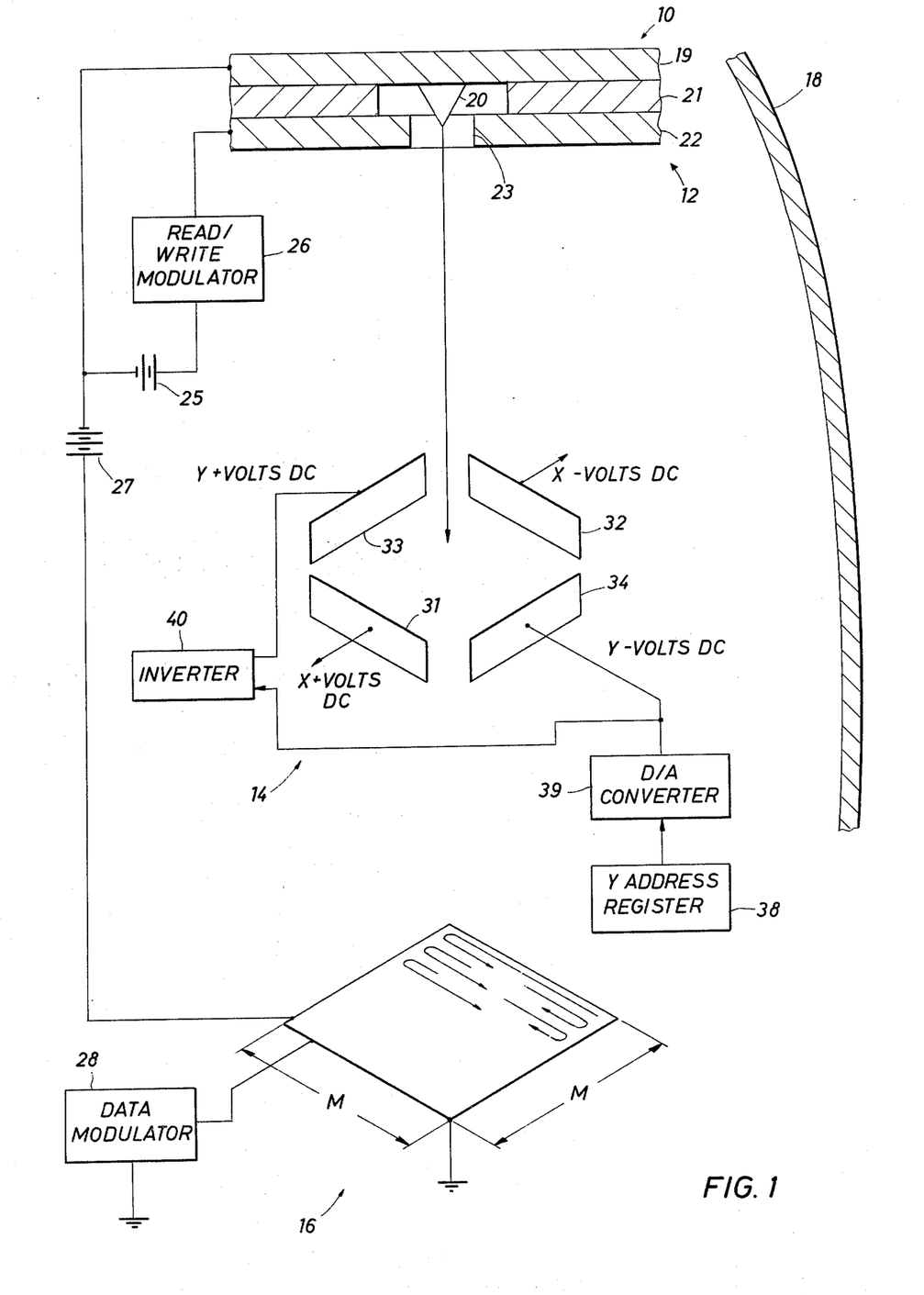
FIG. 1 is a cross sectional view of the field emission cold cathode, the X-Y deflection plates, and the target, all of which are in a sealed container.

Attention is first directed to FIG. 1 of the drawings where the numeral 10 identifies the electron beam accessed memory of the present disclosure. The apparatus is formed of three major assemblies. The first assembly is a field emission cold cathode indicated at 12. The second significant assembly is a set of deflection plates and focusing lense which are indicated generally at 14. The third significant assembly is a semiconductor target 16. Speaking briefly, a beam of electrons is emitted by the cathode assembly 12. The beam of electrons has one amplitude if digital data is to be read and a larger amplitude if digital data is to be written. The beam is emitted, shaped, and deflected, the shaping occurring at an aperture, and the deflection plates 14 direct the beam to a certain bit location. They shape the beam into a relatively narrow pencil beam of electrons. The target itself stores the data and provides output signals when read. The target 16 is divided into individual bit storage areas which have a typical dimension of about 0.15 microns diameter. The target area is typically organized on a square or rectangular pattern of M by M dimensions where M is a whole number integer and typically a power of 2. The target will be described in detail hereinafter. Briefly it is a layered device which forms a charge trap between specified layers. When a specific polarity charge is present, a binary one is written into memory. When the charge is absent or of opposite polarity, a binary zero is written into memory. The charge remains indefinitely but it can be read by scanning with a read beam which forms a binary output current flow through a Schottky diode. The target is thus comprised of M bit storage area which is connected in parallel, so to speak, through an output circuit. The beam formed by the cathode circuit 12 is focused on a particular point and hence, the output signal is correlated with the X-Y address of the point to relate the output signal to the address. All of the apparatus described above is preferably incorporated within a closed container 18. The container is hermetically sealed to exclude air. The operating life average vacuum measures about $10^{-5}$ torr.

Going now to the emitter for the electron beam, it is preferably constructed in the manner described in the works of Charles A. Spindt in an article found in the *Journal of Applied Physics*, v. 39, No. 7, June 1968, pp. 3504–3505, "A Thin-Film Field-Emission Cathode", and is also described in his U.S. Pat. No. 3,789,471, and other patents in his name.

As described in the patents of Spindt, a substrate 19 is formed of a suitable metal or non-metal. If metal, one suitable choice is a sheet of molybdenum. Alternately, a plate of aluminum oxide coated with a film of molybdenum may be used. It is preferably conductive or at least semiconductive to serve as a conductor. The numeral 20 identifies an exposed radiation point. It is preferably conical or pyramidal in shape. Representative dimensions as given by Spindt indicate that a pyramid height of about 0.6 mil will suffice. Spindt describes the pyramid as being formed of a resistive or insulating material or of composite materials where the surface is coated or otherwise treated to obtain the desired emission characteristics.

An insulated spacer 21 is formed of the substrate 19. The spacer height preferably is such that a screen 22 is formed and supported at the spaced location. It has an aperture 23 which will be described. The aperture 23 is preferably centered around the point of the exposed electrode 20. Preferably, the insulator layer 21 is also formed as a larger circular aperture surrounding the emitting electrode. The insulating layer 21 is preferably formed with a dielectric strength sufficient to prevent breakdown between the substrates 19 and 22. Moreover, it is preferably formed by some suitable technique to have no effect on the current flow in the vicinity of the electrode 20.

Briefly, the substrate 22 is charged positively with respect to the electrode 20. The substrate 19 is also conductive. Application of the voltage difference across the substrates 19 and 22 produces a high electric field in the region of the electrode point 20. A negative charge is accumulated on the electrode 20 and in accordance with known principals, collects on the point. The electrode 20 creates the greatest electrical stress and as a consequence, electrons are emitted from the point. The electrons are shaped or otherwise focused into a beam by the electric field created at the opening 23 in the substrate 22. The shaping which occurs forms the electron flow into a beam of relatively narrow diameter.

A power supply 25 is connected between the substrates 19 and 22. A typical range of voltages for the power supply is 30 to 90 volts although other values may be used dependent on scale factors and the like. The numeral 26 identifies a read/write modulator. When a binary data is to be read, the modulator 26 provides no additional voltage to the potential difference between the substrates 19 and 22. When binary data is to be written, the voltage is increased, thereby increasing the current flow in the electron beam. The writing current is about 100 times larger than the read current.

The beam itself is accelerated by a potential difference determined by an additional power supply 27. The power supply 27 provides an accelerating potential difference between the emitting electrode 20 and the target 16. The potential difference determines the energy and hence penetration of the beam. The same accelerating voltage is used for reading and writing the data stored in the target 16. A read-write modulator 28 is connected to the target 16 to modulate the data. The accelerating voltage is typically in the range of 4,000 to about 6,000 volts. For writing, the beam current is increased about 2 orders of magnitude and the data modulates the gate potential. The actual current chosen is dependent on scale factors such as the dwell time of the beam at a given bit location, the thickness of the various layers in the target 16, the distance from the electrode 20 to the target 16, the size of the target bit location, and other factors. The voltages given here are representative and should be sufficient in most applications.

The beam deflector apparatus 14 includes X and Y axis deflector plates. One set of plates for the X voltage is indicated at 31 and 32. They are spaced at opposite sides of the beam. The Y plates 33 and 34 are at right angles to the X plates. They are preferably formed on dielectric substrates which are drilled with a relatively small hole. A suitable hole size can be obtained with a laser beam that will approximate one to five microns in diameter. This is more than adequate in size. A substrate of insulated material is formed with a deposited pair of parallel conductive plates 31 and 32 to serve for the X axis. A similar construction technique is used to form the Y axis plates of conductive material. Metalized, spaced, parallel electrodes are used in the same fashion as in a cathode ray tube although this is a less expensive technique and hence is more desirable. The preferred construction arrangement is fabrication of the deflection plates 31-34 on a substrate with conductive material pads geometrically arranged adjacent to the hole through the semiconductor and which pads are electrically isolated from one another by means of an intermediate dielectric substrate. A focusing aperture including a concentric conductor around the axial hole and about 10 or 15 microns in diameter is acceptable. It is formed with a circular conductive ring electrified to about three to thirty volts difference from the micro-cathode potential at the substrate 19 serves as a focusing ring. This directs the beam through the narrow aperture and through the deflection plates. The focusing ring and deflection plates are formed in multiple layers which have a thickness depending upon the deflection and working distance and may range as high as five mils for deflection capability and structural integrity. The conductor bands or layers incorporating the deflection plates can also be that thick. The dimensions are a function of the optical system design.

The target 16 is spaced some distance from the emitter 20. The target 16 of course includes multiple locations for storage of data bits. If only a single bit were to be stored, the deflection plates could of course be omitted. However, the deflection plates are necessary to position the electron beam to the various locations so that reading, writing, or erasing, as necessary, may occur. To this extent, the target 16 thus defines a mass memory device which is organized on a M by M pattern. The arrangement of the target in this pattern enables data to be obtained or stored in an orderly fashion. The target is some distance from the deflection plates. The deflection plates are positioned relatively close to the emitting cathode 20. A suitable spacing to the target 16 is one or two centimeters. Greater distances can be used in the event the target array is substantially larger. One limiting factor is the deflection angle of the beam on passing through the plates 31-34. Given the constraint of a limited maximum deflection angle, an increase in target size (more bits storage capacity) requires that the target be positioned at a greater distance from the deflection plates. The deflecting voltage can be increased but there is a limit on beam definition, response time on sweeping from one extreme target location to the other, and other factors. Representative dimensions which are believed suitable for most instances are as follows: The grid in the target 16 is preferably up to about 512×512. The individual bit storage area (in actuality a circular storage area) is about 0.15 microns in diameter. This thus defines a rectangular target of about 75×75 microns. As will be appreciated in view of the spacing of the target at one or two centimeters from the deflection plates, the deflection angle is relatively small. It is not normally necessary to sweep it through greater angles. A target dimension of 512 bit positions is not a theoretical limit but rather a practical target size. The target thus can be larger but a convenient dimension is 512 bits.

If the target has a dimension of 512 bits, then a nine bit word, ignoring parity, will describe uniquely each particular target location. To this end, FIG. 1 incorporates a Y address register 38. The register 38 receives and holds a Y address word. The Y address word has nine bits if a 512 bit dimension is assumed in the target 16. For example, ten bits are required if the dimension is 1024 bits. The register stores the Y address and it is thereafter input to a digital to analog converter 39. The converter 39 forms an output voltage which is applied to the plates for the Y axis, thus deflecting the beam. The numeral 40 identifies an inverter which applies the voltage from the converter 39 to the opposite plate. Reasonable scale voltages are about ten volts of swing around ground level for beam deflection. Thus, ground level on the plates 33 and 34 does not deflect the beam but permits the beam to strike the center point of the target 16. The converter 39 is preferably scaled to provide about ten volts maximum for deflection in one direction and minus 10 volts for maximum deflection to the far side of the target. This again is a scale factor. The deflecting voltage may be scaled upwardly or downwardly. It is increased in the event that the deflection angle is too small. It can be decreased if the deflection angle is too great. The deflection angle can be varied dependent on the distance to the target, accelerating voltage and other factors. Accordingly, the maximum output voltage of the D- to -A converter 39 can be increased or decreased. The ten volts full scale output is a very workable nominal value. It can be scaled downwardly by the use of a voltage divider circuit utilizing percision resistors. This then means that when the maximum voltage is ten volts and the number of bit locations is 512 that each location is defined by a incremental voltage of 20/512 volts or 39.06 millivolts. The same is true for the X plates 31 and 32.

TARGET DESCRIPTION

Figure 2:
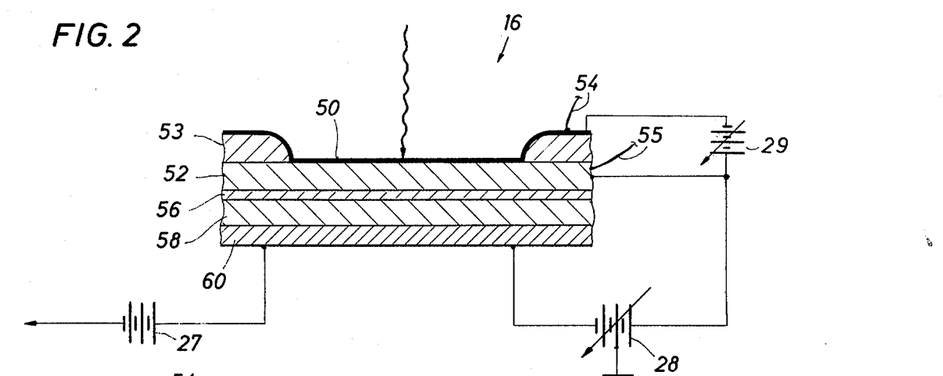
FIG. 2 is a sectional view through the target of the present invention showing the various layers which comprise the target.

Going now to FIG. 2 of the drawings, the target 16 is shown in an enlarged sectional view. The target 16 is uniformly constructed across the entire area of M by M. The target can be constructed in several ways. The semiconductor construction techniques required for the target are believed specified later. The use of any other particular construction technique is also permitted. The target 16 is positioned perpendicular to the undeflected beam. It has the requisite number of locations determined by the M by M position of the electron beam. The bit locations are therefore all identical. They are distinguished one from another only by physical location. They are not mechanically isolated from one another. The target 16 will be described from the top down. The description proceeding from the top down relates the function of the various layers in the target 16 to the electron beam which impinges upon it. To this end, the construction of the preferred embodiment of the apparatus is as follows:

On the top, a relatively thin conductor layer 50 is illustrated. The preferred metal is aluminum. It is preferably about 250 angstroms thick. This layer functions as one of the terminals of a Schottky diode with the doped silicon layer therebelow. The beam penetrates the aluminum layer 50. The conductor is preferably thin and of low density to minimize scattering of the electron beam.

Each bit location is about 0.15 microns in diameter. It will be understood then that the entire aluminum layer forms a single diode but it is beam activated only at one bit location at a time. Accordingly, it is appropriate to speak of a single diode at each bit location which diode has a diameter of about 0.15 microns. The relatively thin aluminum deposition is laid over a silicon semiconductor layer 52. The layer 52 is relatively thick, in the range of 500 to 1500 angstroms thickness. By contrast, the aluminum layer is only about 250 angstroms in the preferred embodiment. The silicon layer is appropriately doped with N type or P type impurities. The preferred embodiment is N type. The amount of doping is about $10^{16}$ to $10^{18}$ per cubic centimeter. The dopant concentration is less than that which would allow tunneling across the diode depletion region, but sufficient to cause a low value of diffusion coefficient. It is sufficient to create the Schottky diode in conjunction with the metal deposition on the top surface. The dopant selected is any of those customarily used for obtaining N or P doping.

The numeral 53 identifies a dielectric insulator such as silicon nitride or aluminum oxide which borders around the target 16. It adds a rim or border which leads mechanical strength to the structure. Moreover, it defines the outer limits of the target. It does not function in the target operation itself. It has nothing to do with the storage of data in the target. It merely indicates the limits of the target and also limits the area where the Schottky diode is constructed. Its width is also immaterial and need not enter into consideration.

Figure 3:
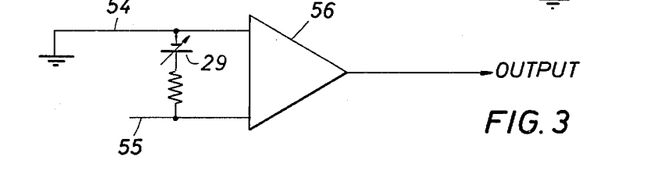
FIG. 3 is a schematic diagram of an amplifier for obtaining an output signal from the target.
Figure 4:
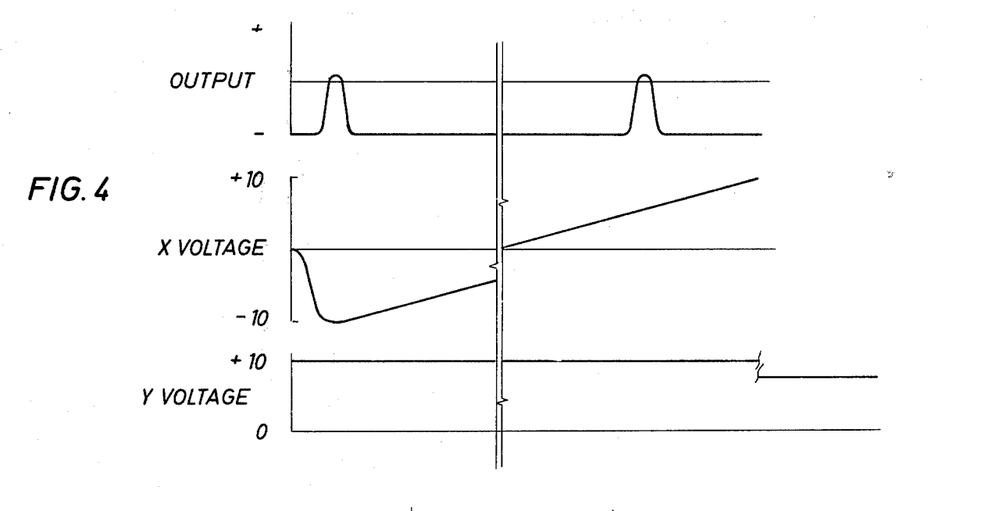
FIG. 4 is a timing chart showing output signals relative to the signals applied to the X-Y deflection system.

As will be understood, the metalized top layer 50 and the silicon layer 52 extend across the width and length of the target 16. They form a Schottky diode, and to this end, they are provided with the terminals 54 and 55. In FIG. 3, the terminals 54 and 55 are connected as inputs for an output inverting amplifier 56. A suitable operating bias voltage is provided across the diode and input terminals of the amplifier. The amplifier 56 itself forms an output signal which is amplified to a suitable level dependent on the signal from the Schottky diode. As will be explained below, the output signal from the amplifier 56 is unique to a specified bit location in the target 16 which is specified by the X-Y address of that location. The beam is directed to that location.

The numeral 56 identifies a relatively thin silicon dioxide dielectric. The layer 56 is relatively thin, typically in the measure of about 25 angstroms but it can be varied dependent on voltages. Preferably, the quality of the layer 56 throughout the target 16 is well controlled as is well practiced in MOS gate insulator technology.

The numeral 58 identifies a suitable dielectric layer preferably formed of silicon nitride, or as a second alternative, aluminum oxide, which has a thickness of about 300 to 500 A°. This range of thickness defines a suitable polarizing field for charges which are held in this layer as described. The layer has low mobility of charges to isolate adjacent bit storage locations. The bottom most layer 60 is defined by a relatively thick aluminum gate structure. The gate structure is as much as one micron or more thick. It is fairly thick to define a supporting base or foundation for the comparatively thin layers which are carried on it. It also serves as an electrical terminal which is connected to the voltage source 28 for data modulation purposes and a source 27 for accelerating purposes. In other words, the accelerating potential applied across the system shown in FIG. 1 is applied to the metal gate 60. The read/write wave form is also applied to the gate 60.

At this juncture, the device should be considered as having five operative layers. The base layer of metal is a terminal of the gate-to-seminconductor polarizing voltage and mechanical support and does not enter into a storage operation per se; rather, it enables the accelerating potential applied to the electron beam to be grounded in a suitable manner.

OPERATION OF THE MEMORY DEVICE

It is best now to consider the operation of the device in three operations. The operations are the writing of a binary one, the writing of a binary zero, and the reading of the data written at a given bit location. At this juncture, beam deflection will be ignored and it will be presumed that the beam is directed to a specified location. As a beginning point, it will be presumed that no prior data has been written.

When an electron beam enters and passes through the layer of metal identified at 52, it gives up some energy. Preferably, the beam is accelerated to about 5000 electron volts (ev) with a current flow that is in the range of about one nanoampere. When the beam enters the layer 50, a certain portion of the energy is dissipated, less than 2000 electron volts (ev) of energy is dissipated in that layer. This then leaves the electron beam with an energy level of about 2000 to 4000 ev to dissipate within the silicon layer. When each electron strikes the silicon layer, it ionizes a charged pair, namely an electron and a hole for each 3.6 ev of energy dissipated and an adequate number of charged pairs is liberated in the silicon layer 52.

FIELDS IN THE SEMICONDUCTOR

Prior to the introduction of the electron beam into the silicon layer 52, two fields exist. The first field extends across the depletion region of the Schottky diode, extending from the interface of the top metal electrode 50 into the silicon layer 52. The width into the silicon layer 52 is controlled by the bias supply 29, and in the preferred embodiment using n-doped silicon, the negative terminal of supply 29 is connected to the metal connection to the diode at terminal 54, and the positive terminal of supply 29 is connected to the silicon at terminal 55. The second field exists between the surface of the silicon 52 and its interface with dielectric layer 56. The existing surface charges resulting from unsatisfied bonds with the silicon any contaminants and mechanical discontinuities that may exist, and the charges captured near the interface between dielectric layers 56 and 58, cause that surface of the silicon to be accumulated, and therefore the conductivity at the surface to be greater than in the bulk of silicon layer 52. In the preferred embodiment the Schottky diode field is depleted of electrons and the silicon surface near the interface with dielectric layer 56 is accumulated with electrons.

When the energy of the beam of electrons is expended in the silicon 52 and its depletion region, the charge multiplication created by the ionization process both produces a field in the semiconductor and results in a current amplification in the semiconductor, increasing the current in the semiconductor by two orders of magnitude or more over the amplitude of the electron beam current. The multiplicity of ionized charge pairs created by the exhaustion of the electron beam energy, are separated by the fields in the semiconductor. The beam of electrons in the semiconductor functions as a virtual electrode in the semiconductor. The polarity of that electron beam electrode is a function of the polarity and magnitude of the supply 28 connected between the gate 60 and semiconductor 52. The ionized pairs created in the Schottky diode depletion region of the semiconductor tend to be separated by that depletion region field and drift rapidly, in a few nanoseconds or less, to the corresponding diode ohmic contacts creating particle and displacement currents which appear in the load circuit at the input to amplifier 56. Charge pairs created in the semiconductor-gate field, of which the energy-exhausted electron beam is one terminal, in combination with the polarizing bias supply 29, are separated by that field and tend to recombine with opposite polarity charges at the semiconductor-dielectric interface, or, in the high field conditions of the writing mode, are accelerated by the high field and tunnel across the thin dielectric layer 56, and are captured near the interface between dielectric layers 56 and 58. Conversely, charges of opposite polarity previously captured near that interface can be caused by the high, writing field to tunnel back through to the silicon, thus overwriting or erasing previous data stores as charges.

BIT STORAGE DENSITY

Lateral diffusion or spreading of charges, affecting data storage density, is controlled by the thickness and conductivity of the semiconductor. High semiconductor conductivity and thin film of the semiconductor produces low diffusion coefficient of the charges and minimal spreading, particularly in the silicon accumulation region near the semiconductor-dielectric interface where conductivity is the highest. The thickness of the semiconductor 52 for a given semiconductor material, doping density and electron beam energy, is made to satisfy four criteria: Firstly, that the electron beam energy is exhausted in the semiconductor before reaching the dielectric layer 54; secondly, that sufficient electron beam energy is exhausted in ionization of charge pairs to produce the current amplification required for either writing or reading operations; thirdly, that the semiconductor layer 52 is thin enough to create the bit area storage density desired, an explained below; and fourthly, that the Schottky diode depletion area width into the semiconductor is sufficient to withstand the field created in the semiconductor. The criteria will now be considered in detail. Current amplification, as explained in prior paragraphs, occurs as the energy of the beam of electrons is exhausted in the penetration of the semiconductor. For a given electron beam energy, or accelerating voltage, the average depth of beam penetration is a function of the semiconductor density. For silicon semiconductors, and an energy of 4 Kev, the average depth of penetration is about 2200 Angstroms. In that portion of the silicon thickness, an average of 4000/3.6 or 1250 charge pairs would be created per electron by ionization. Since 2200 Angstroms is the average depth of penetration for a beam of 4 Kev energy, the silicon layer 52 should have such additional thickness as to prevent electrons from reaching dielectric layer 54 to avoid ionization of the dielectric layer and consequently cumulative fixed charge creation in that dielectric. For a small diameter electron beam, 600 Angstroms mean diameter or less, charge pair diffusion rather than beam spreading is the major factor affecting bit storage location density. The effectual diffusion of created charges occurs outside of the Schottky diode depletion region field within the semiconductor, between the depletion region edge and the semiconductor-dielectric interface. The width of the depletion region into the semiconductor is controlled by bias source 29. That undepleted width in the semiconductor should be made less than the desired spacing between bit storage locations so that when reading stored information, the charges created in the semiconductor not recombining at the semiconductor-dielectric surface will be nearer to and more probably captured by the Schottky diode field than diffusing to and recombining at neighboring attractive bit storage locations. The width of the Schottky diode depletion region should be sufficient to support the field created in the semiconductor by the electron beam, the width being adjustable by bias supply 29.

POLARIZATION OF THE FIELD IN THE SEMICONDUCTOR

In a writing operation, the bias voltage 28, applied between semiconductor 52 and gate terminal 60, produces a field which is used to polarize the field created by the electron beam at one of the N by N positions in the semiconductor. Since the polarizing field between gate 60 and semiconductor 52 by construction covers the whole N by N area of data storage positions, only one of which is addressed by the electron beam, for proper operation that polarizing potential must meet several criteria: Firstly, the combination of the field created in the semiconductor and the gate to semiconductor fields, including that supplied by the polarizing potential, surface state and dielectric-trapped charges, must be sufficient to both select the polarity of the cause tunneling of the charge across dielectric 56 into dielectric 58. Secondly, the field produced in the remaining N by N storage area by the polarizing potential of supply 28, must not be sufficient to cause tunneling of charges in those non-addressed locations. The field produced by the polarizing supply 28 is a function of the potential and the thicknesses of dielectric layers 56 and 58. For example, if we assume nominal values for both previously written charges and for surface state charges, and 2.5 nanometers thickness for dielectric layer 56 of silicon dioxide, and 35 nanometers thickness for dielectric layer 58 of silicon nitride, then the potential applied by source 28 should not exceed 5 volts. The remaining field required about $7.6 \times 10^6$ v/cm or about 1.9 volts across the 2.5 nanometers thickness of dielectric 56, must be supplied by the field created in the semiconductor by the electron beam. In a reading or off condition, the gate electrode 60 is placed at the same potential as the semiconductor 52. When the gate electrode is made positive with respect to the semiconductor in a writing operation, electrons are caused to tunnel across dielectric 54 into dielectric 56 and combine with holes in that dielectric, or to be captured, resulting in less surface accumulation and higher recombination velocity in a subsequent reading operation. When the gate electrode 60 is made negative with respect to the semiconductor potential in a writing operation, holes recombine at the surface and are caused to tunnel through dielectric 54 into dielectric 56, and be captured, or electrons caused to tunnel back through dielectric 54 producing greater surface accumulation and a lower surface recombination velocity in a subsequent reading operation.

The charge near the dielectric-dielectric interface prior to any operations, and due to manufacturing processes can be varied monotonically increasingly positive at deposition temperatures for silicon nitride below about 850° C., and increasingly negative at temperatures about 850° C.

SUMMARY OF WRITING OPERATIONS

To write a binary zero, the following conditions must occur:

1. The desired single position of the N by N possible positions is input in binary form to the X and Y Address registers 38, converted into an analog voltage for the X and Y coordinates of the address by Digital-to-Analog converters 39, connected to deflection plates 31–32 and 33–34, respectively, which analog voltages cause the beam of electrons to be positioned at the selected location.

Figure 5:
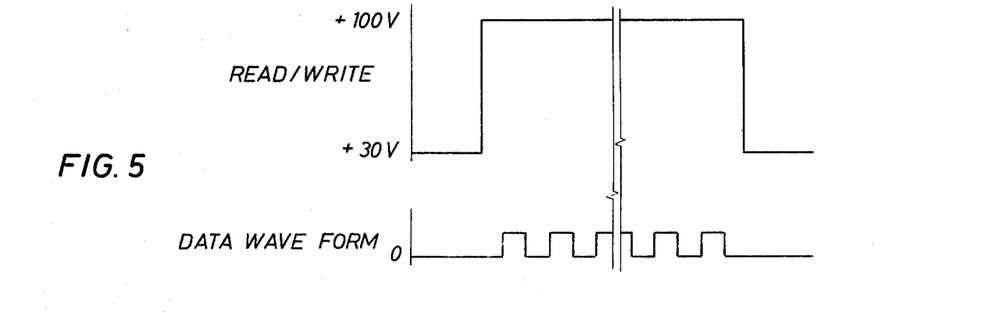
FIG. 5 is a timing chart showing the relative voltages for the read and write modes of operation and also showing how data is input to the device.

2. The Read/Write Modulator 26 must be in the write condition, supply the higher voltage as indicated in FIG. 5 to the field emission cathode to produce the higher, writing beam current and consequently sufficient field in the semiconductor to cause tunneling and capture of charges across dielectric 56 into dielectric 58.

3. In some designs it may be necessary to change the potential suppled by 29, across the Schottky diode terminals 54,55, to effect a change in the diode depletion width into the semiconductor, which width would differ in the reading and writing operations. In such a design, a Read/Write signal of the same timing but of a differing sufficient amplitude and polarity would be applied as a portion of bias source 29 to effect the desired change.

4. The Data Modulator must be in the positive, binary one, state of the data waveform, FIG. 5, applying a positive voltage from gate 60 to semiconductor 52, polarizing the electron beam locally created field in the semiconductor and causing electrons to tunnel across dielectric 56 and be captured in dielectric 58 or combine with holes in dielectric 58. When the Data voltage returns to the same potential as the semiconductor, the reading condition, and when the electron beam field is reduced to the reading level, the tunneled charges are frozen in, and result in less surface accumulation and higher surface recombination velocity.

To write a binary one, the following conditions must occur:

1. Conditions 1, 2 and 3 are the same as for writing a binary zero.

2. The Data Modulator must be in the negative, binary zero, state of the data waveform, FIG. 5, applying a negative voltage from the gate 60 to semiconductor 52, but not so negative as to produce an inversion layer in the semiconductor, said negative voltage being sufficient to polarize the electron beam created field in the semiconductor and causing holes to tunnel across dielectric 56, or electrons to tunnel back across dielectric 56, resulting in charges being frozen in when the gate voltage is returned to zero volts with respect to the semiconductor potential.

READING OPERATION

The same accelerating voltage is used as in writing. The Read/Write Modulator 26 is set to Read, the low voltage condition of FIG. 5, reducing the electron beam current to 1/100 of the current used for writing, about 10 picoamperes, insufficient to cause tunneling. The beam is positioned to the desired storage location, as in writing, by the binary address in Address Registers 38, and deflected by the analog voltages derived from digital-to-analog converters 39, applied to deflection plate pairs 32,32 and 33,34, respectively.

The reading beam current is amplified, as in the case of writing, by ionization of a multiplicity of charge-pairs. The excess holes created, in the preferred embodiment, must either recombine at the semiconductor surface near the interface with dielectric 56, or be captured by the field of the Schottky diode. The insignificant number of holes recombining in the bulk silicon can be neglected. The charge pairs created in the semiconductor near the semiconductor-dielectric interface are affected by the surface recombination velocity. In the preferred embodiment, as the surface recombination velocity increases, fewer and fewer holes are captured by the field of the diode and more and more of the excess holes created by the reading beam recombine at the surface. A stored binary one corresponds to high recombination velocity, and a stored binary zero corresponds to low, near zero, recombination velocity. If a binary zero is read, nearly all excess holes will be captured by the field of the diode and appear as a modulation on the output current between terminals 54 and 55, which are connected to amplifier 62. Amplifier 62 responds to the voltage created by the diode current flowing through supply 29 and the load resistor, producing a positive voltage corresponding to a binary one, and a ground potential corresponding to a binary zero.

MANUFACTURE OF FOCUSING AND DEFLECTION APPARATUS

Figure 6:
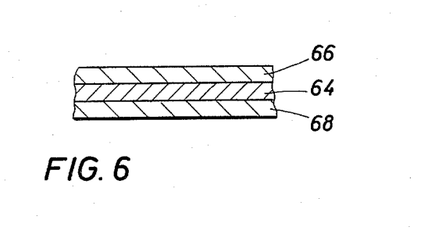
FIGS. 6, 7, 8 and 9 are steps in the one manufacturing process of a combined solid state focusing lense and deflection plate system for directing the electron beam toward a specified location.

To this juncture, the apparatus has been described in operation. It has been described and specified so that the operative components of the equipment including all the structure shown in FIG. 1 are correctly assembled. Representative current and voltage levels have been given for the electron beam deflection equipment. However, it is perhaps helpful to supply additional details of the device. One detail is the manufacturing procedure for the fabrication of the immersion lense and the deflector elements. It is preferable to form an immersion lense in a semiconductor along with the deflection plates 31–34. Attention is thus directed to FIG. 6 of the drawings which shows a preliminary step in the manufacture of the immersion lense and deflection elements jointly. The immersion lense is used to focus the beam of electrons from a wider beam into a narrow beam of controlled diameter. In FIG. 6, a wafer 64 of suitable doping and resistivity supports upper and lower layers to be described. The layer 64 is typically doped with P material to have about one ohm-cm. resistivity. There is deposited or otherwise formed on it by oxidation or deposition layers of silicon dioxide 66 and 68. The silicon dioxide has a thickness which is determined by the immersion lense design. The insulator layer 68 defines the separation between the limiting aperture to be formed in the lense. The typical range of thicknesses for the layers 66 and 68 is about one to two microns each.

Figure 7:
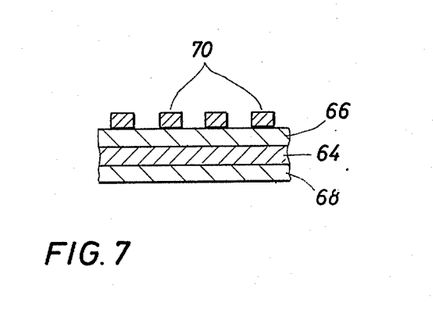

The oxidized layer 68 is protected with a photoresist or some other mask. Through the use of photolithographic processes known in the art, contact holes are formed in the oxide layer 66. Through the use of chemical or plasma etching techniques again well known in the art, the oxide layer 66 is removed down to the wafer or substrate 64. Thereafter, vapor deposition techniques are used to place on the oxide 68 a doped polysilicon typically having a resistivity in the range of about 12 to 50 ohms per square centimeter. This is indicated by the elongate islands 70 shown in FIG. 7. The separate islands 70 are then shaped and formed through photolithographic processes to define the X-axis deflection elements. Thus, FIG. 7 shows individual X-axis elements which will be positioned as described relative to a hole in the apparatus to form a deflective voltage acting on the electron beam. The spacing between neighboring elements should be less than the diameter of the hole to be drilled later through the several layers. This enables the hole to define the precise spacing of adjacent elements 70. It will be appreciated that two separate deflector plates are provided for each hole to be formed through the solid state system shown in FIGS. 6 and 7. In other words, the two plates provide positive and negative voltage levels which form a field across the hole to be formed in the apparatus to thereby deflect the electron beam.

Figure 8:
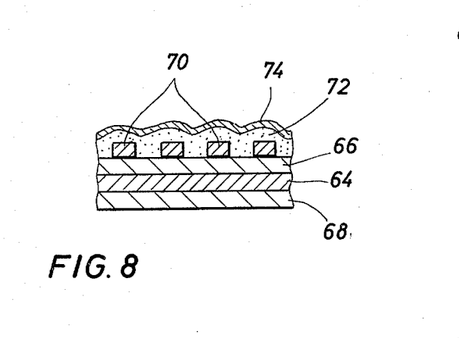

FIG. 8 shows the apparatus after the next two steps of manufacturing. The polysilicon islands 70 are of course formed to a specified thickness and are located on the top side. They then support a subsequent deposit by plasma or pyrolytic techniques of a further insulative layer of silicon dioxide 72. The layer 72 serves as an insulator and is preferably formed to a thickness of about one micron. It can be thicker as required. It covers over the islands 70 which are left on the top side of the assembly.

The numeral 74 identifies a thicker layer of aluminum which is subsequently deposited to a thickness of about one or two microns. The aluminum layer 74 is formed by suitable techniques known in the art, and in the alternative, other conductive metals can be used. Through the use of photolithographic techniques, the layer 72 is thereafter formed into Y-axis deflection elements. They are collectively at right angles to the deflection elements 70.

Reviewing to this juncture, it will thus be seen that a set of individual conductive X-axis elements are defined at 70 and the layer 74 is shaped or etched to form Y-axis conductive elements. Both sets of conductive elements are carried to the edge of the fabricated structure and are exposed for easy connection to suitable voltage sources. Next, a set of holes is formed in the multiple layers. The holes are centered so that they pass between adjacent X-axis pads and are also centered between Y-axis conductive pads. The conductive pads for the Y-axis are formed in the layer 74 as will be recalled. It is possible to use photolithographic techniques to form the holes. In the alternative, plasma techniques can be used. Mechanical techniques are also acceptable. However, it has been found that a convenient and easily controlled technique is to use a laser beam to drill a hole ranging between about three to five microns in diameter through all layers. The hole is centered as described above between the X and Y deflection elements.

Figure 9:
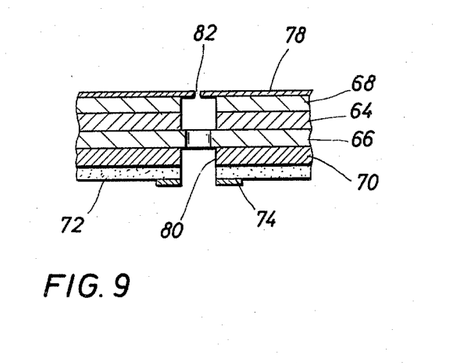

The entire apparatus is then inverted and through the use of known spinning techniques, a deposition is made at a grazing angle on the drilled lower layer of silicon dioxide. In other words, the layer 68 is now on the top and a suitable conductive metal, aluminum being the preferred metal, is deposited on the top face as is identified by the numeral 78. Through the use of spinning techniques, the hole 80 previously drilled in the multiple layers is partly closed over to a narrow or constricting aperture 82. The narrow beam limiting aperture is concentric of the hole 80 and is smaller in diameter. However, it does not fully close.

The application of a suitable potential to the layers 64 and 78 defines a limiting aperture simple immersion lense for focusing the electron beam. The layers 66, 68, and 72 are layers of silicon dioxide serving as insulators separating the several components. The side view of FIG. 9 shows the X deflection elements 70. The Y deflection elements 74 are perpendicular to the elements 70. The end result is an aligned lense and deflection system utilizing laser beam drilling techniques to obtain a device which is manufactured in a batch process. Moreover, it has extreme accuracy in the positioning of the holes through the device. It should be noted that a single device is shown in FIGS. 6 through 9 but it is contemplated that multiple electron beam sources arranged in a apecified grid pattern will function cooperatively with a set of immersion lenses and appropriate deflection axis.

TARGET MANUFACTURING PROCESS

The next manufacturing process to be described is one suitable for manufacture of the target 16. To restate the description of the target 16, reference is made to FIG. 2 of the drawings where the target 16 is shown to incorporate five layers of operative materials. The layers are from the top or the side on which the electron beam impinges are a first layer of metal, a second layer of semiconductor, third and fourth layers which differ in thickness and which are dielectric layers, and a bottom layer which is a conductive metal substrate or gate. To use the device in the best way possible, it is necessary to place an appropriate set of connective pads around the periphery for connecting suitable bias voltages to the Schottky diode and between the semiconductor and the metal substrate. Quite obviously, other manufacturing techniques can be used to provide a structure which conforms in general with the description of the target 16 set forth above. In any case, a procedure for manufacture of the target is the following.

Figure 10:
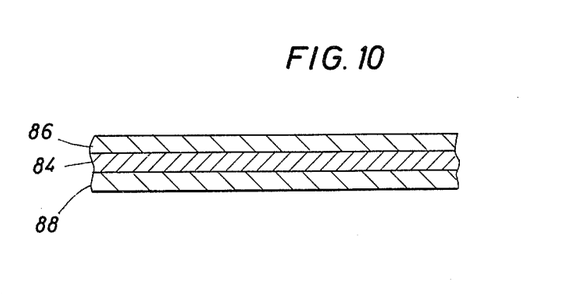
FIGS. 10, 11 and 12 are steps in one manufacturing process of a target for beam storage and reading of data.
Figure 11:
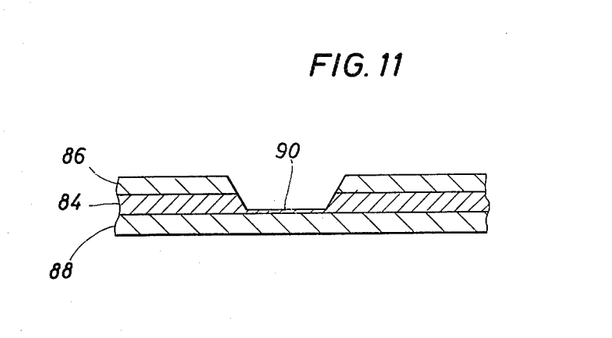

Through the use of chemical or plasma discharge techniques, a wafer of suitably doped silicon is thinned to a thickness of about ten microns or less. The actual thickness is dependent on the size of the target area desired (the number of bits to be stored therein determine the target area size) and whether or not subsequent edging techniques are anisotropic. FIG. 10 is representative of this and depicts the silicon layer 84 with grown oxide thicknesses 86 and 88 on both surfaces. Photolithographic techniques are then used to define areas to be etched away. Etching utilizing photoresist proceeds and etch pits are formed. One such etch pit is shown in FIG. 11. Of course, standard chemical silicon etch techniques, on alternately plasma discharge techniques, or anistropic chemical etches can be used. In any case, a membrane is formed which is about two microns thick in the silicon layer 84. This is in the center of the etch pit 90. FIG. 11 presupposes that an anisotropic process is used. It will be observed that the very thin membrane is mechanically supported by the unetched thicker sections surrounding its periphery. The membrane 9 has dimensions which equal or exceed the size of the target.

Thereafter, through the use of chemical or plasma cleaning techniques, the remaining silicon dioxide layer 86 is removed and the wafer is cleaned.

The next step is to grow about 25 A° of clean silicon dioxide on the wafer. This step is normally carried out at a relatively low temperature, typically about 600° C. or lower. This layer is identified by the numeral 92. The next step is then to deposit silicon nitride at a temperature of about 700° C. This layer is identified by the numeral 94. The exact temperature, whether above or below a specified temperature (usually 700° C.), depends on the magnitude and sign of the charges desired to be trapped or eliminated from capture near the oxide/nitride interface. This layer has a thickness in the range of about 350 to 500 angstroms. The preferred thickness is about 450 A°.

Through the use of standard photolithographic techniques, the area of the unetched side are exposed and suitable contact holes are formed in them. This refers to the lower side of the silicon wafer 84, or the side 88 opposite to the etch pit 90.

The contact holes are etched through the successive layers to enable connection with the strata of the device. The semiconductor layer in the pit 90 may be chemically exposed on the lower side to permit ion implantation for the purpose of altering the resistivity of the silicon to enable ohmic contact.

Thereafter, a suitable conductor, typically aluminum, is deposited to a thickness of 10 microns or greater. This is identified by the numeral 96. At this juncture, it will be observed that a relatively thin silicon membrane supports the deposited layers of silicon dioxide 92, silicon nitride 94, and the aluminum conductor layer 96.

As will be understood, care must be taken to isolate the gate layer 96 from conductors intended for other strata of the device. This can be achieved through the use of standard photolithographic etching techniques.

Figure 12:
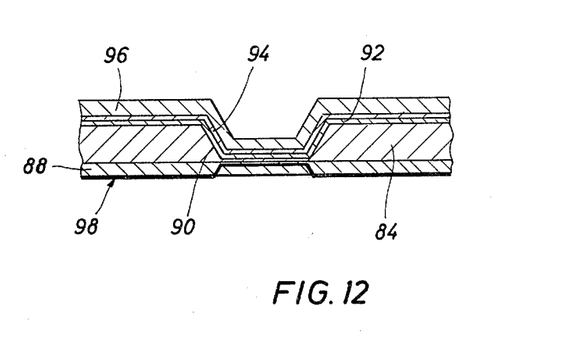

At this juncture, the wafer of FIG. 12 includes four layers adjacent to the etch pit 90. These four layers describe the structure shown in FIG. 2 except, however, the connections are omitted and the top metal surface has not yet been applied. The silicon substrate 84 is inverted and through the use of photolithographic techniques, suitable patterns are formed on the face (now the top face). The exposed silicon is then etched to the final desired thickness. This may not be necessary if the silicon layer was controllably etched in the prior steps described above. However, it is sometimes desirable to leave it overthick so that the surplus portion can thereafter be removed. This provides adequate mechanical structure as the steps proceed in the fabrication of the semiconductor target. After the face of the wafer 84 has been etched to thereby controllably define the central membrane of silicon, then aluminum or some other low density conductor material is sputtered or otherwise deposited to a thickness of about 20 to 25 nanometers. This is identified by the strata 98 shown in FIG. 12. It should be kept in mind that the strata 98 is normally applied from above and this is achieved upon inverting the silicon wafer.

At this juncture photolithographic techniques are used to delineate the metal layer 98 and the necessary metal runs for interconnection.

Prior to depositing the thin aluminum layer 98, the silicon dioxide layer 88 is etched away to leave rings or islands. These serve as an insulator ring which defines an individual target area. It should be kept in mind that the process described herein is a batch process for the manufacture of many targets in a given wafer. The targets of course have geometric dimensions which are determined by the spacing of the electrodes and in this sense, the dimensions must be correlated to the dimensions of the deflection and immersion lense apparatus.

In any event, the five layers for operation of the target are now defined and joined to one another through the techniques described above. It is then only necessary to scribe the wafer into dice of suitable sizes and break them into separate pieces. Scribe lanes can be used for this and the method of breaking the wafer into various dice is well known in the art.

MEMORY ORGANIZATION

It is possible to use the present invention as a single unit; by that, reference is made to a single electron beam source and a single target 16. A more practical approach is to use several of the storage devices as a group. One manner is to group nine together so that they are drive by common X and Y axis bit location words. The nine targets are independent of one another and therefore provide nine output bits in parallel. This can be used for a memory system where the word length is eight bits including an extra bit for parity. Alternately, the word length can be varied to any desired length so that the several targets output the required number of bits in parallel. Quite obviously, for each target, there must be an electron beam source and a beam deflection assembly.

The beam deflection assembly can be formed with a minimum number of conductors by interleaving the positive and negative X delection plates. For instance, if a nine bit word is to be stored utilizing nine targets which are constructed as a common assembly (noting that each one is electrically isolated from the adjacent but they are formed by conventional batch methods and spaced apart, it is then possible to construct a single beam deflection assembly for the nine bit memory. Such a deflection assembly would include nine drilled openings for the nine respective beams and there would be ten parallel deflection plates alternately spaced between the nine holes. For the first hole, a positive plate would be located on one side and a negative plate would be on the other side. For the adjacent hole, one of the two plates would be shared with the first beam. As a consequence, alternate targets would be organized in the X dimension in opposite hand. In other words, alternate electron beams would deflect to the right and to the left. By the same token, the Y deflection plates would number only two and would serve all of the the electron beams in common. This of course is an expedient which can be utilized depending on the organization and layout of multiple targets on a common plane sharing a common housing and other common facilities.

DATA STORAGE

Heretofore, a description has been given on the relationship between reading and writing currents. A third current level is optionally usable in which the current is reduced even further from the reading current by as much as one or two orders of magnitude. Such a reduction in current level, coupled with the removal of the focusing voltages from the immersion lense assembly, provides a condition where the device will rest in a state of preparedness, neither reading or writing, and yet be switched on with no "warmup" on switching. A reduced current of this level coupled with removal of the focusing voltages does not change any of the data stored in the target 16. The same condition can be used during intervals of short duration when no data is being written or read.

Depending on the manner in which the memory is to be used, it may be necessary for it to remain idle for short intervals. There are two techniques available that are perfectly acceptable. One is reducing the current as described above. Another technique is to form an electron beam at least of the size required for reading and drive it off scale, away from the usable area of the target. In other words, it does not strike the target area itself but the surrounding peripheral supportive structure. It is no problem to direct the beam to the side and in particular there is no accumulation of static charges which cause problems of unwanted beam deflection. The target 16 is basically grounded at the lowermost metal layer 60 so off target deflection is no problem.

The foregoing descriptions are directed to the preferred embodiment of the device although it clearly can be constructed in many different ways. It is intended for a mass memory but can be used in mass memory applications, as a scratch pad, or in any other fashion. It is able to be organized depending on the requirements of the programmer in practically any fashion deemed appropriate. The fabrication techniques described herein are not a limitation on the device. All three of the major assemblies, the beam emission apparatus, the deflection and focusing apparatus, and the target 16 can be constructed in the stated manner or in some alternate fashion. It will further be appreciated that the voltages and dimensions given herein are no limitation on the device; they are representative of operative measures and can be varied.

In any case, the foregoing is directed to the preferred embodiment but the scope thereof is determined by the claims.

What is claimed is:

1. An electron beam storage apparatus comprising:
   (a) an electron beam source which forms an electron beam directed toward a target;
   (b) a target which is formed of a semiconductor into which the electron beam is directed forming ionized charged pairs therein, and further incorporating a dielectric adjacent to said semiconductor which dielectric stores charges therein from said adjacent semiconductor; and
   (c) an accelerating voltage source connected to spaced terminals for applying an accelerating voltage for imparting energy to electrons of the electron beam sufficient to penetrate into said semiconductor, but which energy level is not sufficient to penetrate through said semiconductor to said dielectric layer.

2. The apparatus of claim 1 including focusing means operative on the electron beam for focusing it into a defined beam width where it impinges on said target.

3. The apparatus of claim 1 including a transverse memeber approximately perpendicular to the directional propagation of the beam of electrons which has an opening formed therein for the beam to pass through and further including an electrically charged beam focusing electrode positioned about said opening.

4. The apparatus of claim 1 wherein said target has a specified length in a given dimension and further including a deflection plate apparatus positioned along the path of the beam from said source to said target which deflects the beam toward specified multiple locations on said target which locations define multiple bit storage areas.

5. The apparatus of claim 4 wherein said target has a specified length in a second dimension which is perpendicular to the first dimension so as to define multiple bit storage locations in said target in two dimensions and including a second deflection plate apparatus for controllably deflecting the beam to a specified location defined in two dimensions.

6. The apparatus of claim 1 including at least a pair of electron beam sources and at least a pair of targets similarly constructed, each target being assigned to a specific beam source.

7. The apparatus of claim 1 wherein the dielectric and semiconductor of said target have planar extent with adjacent but separate bit storage areas defined by the charge mobility of charges in said dielectric.

8. The apparatus of claim 1 wherein the dielectric is formed of first and second adjacent dielectric layers and charges from said semiconductor are stored in the second layer after tunneling through the first dielectric layer, and said first dielectric layer is sufficiently thick to prevent random tunneling therethrough absent a field above a specified potential across said first dielectric layer.

9. The apparatus of claim 8 including a bias voltage source and terminals for applying the bias voltage across said first dielectric to produce a field across the dielectric layer above the specified potential sufficient to cause tunneling across said dielectric layer.

10. The apparatus of claim 1 wherein said semiconductor is in the form of a layer and forms charged electron and hole pairs therein as a result of impingement of said beam thereon, and wherein said dielectric is a selective receptor of charges of one polarity which tunnel thereinto.

11. The apparatus of claim 1 wherein said target incorporates an interface between said semiconductor and said dielectric across which tunneling occurs to store a charge to represent a stored data bit, and said dielectric, when suitably biased, permits reverse tunneling thereacross to enable selective overwriting of a previous stored data bit.

12. The apparatus of claim 1 wherein said dielectric and semiconductor have an interface and a charge, formed of either holes or electrons from said semiconductor, is tunneled across the interface in said dielectric and stored therein upon application of a suitable bias voltage across said interface.

13. The apparatus of claim 1 wherein a bit of data is stored in the dielectric in the form of a charge having a centroid therein at a specified location and said charge has a specific polarity, and said charge is removed on subsequently writing at the same location by charges of the opposite sign moving from said semiconductor into said dielectric by tunneling across the interface between said semiconductor and said dielectric.

14. The apparatus of claim 1 wherein said target area is defined along a pair of perpendicular dimensions to include multiple data bit storage locations which data bit storage locations are in said dielectric and are isolated from one another by a distance which, coupled with the mobility of the charges in lateral movement within said dielectric, thereby isolates adjacent locations, there being a conductor affixed to the opposite side of said semiconductor layer to define a Schottky diode thereat which functions as a Schottky output diode for the multitude of bit locations and which diode forms output signals on tunneling from said dielectric into said semiconductor layer.

15. The apparatus of claim 1 wherein said electron beam source and target are both located in a hermetically sealed chamber means wherein said chamber means is evacuated to a vaccuum of at least $10^{-6}$ torr.

16. The apparatus of claim 1 including means for altering current in said electron beam between a read current and a write current wherein said write current is larger and said write current, when impinging on said target, forms ionized electrons and holes in said semiconductor which are electrostatically separated and one is attracted to a preexisting charge in said dielectric.

17. The apparatus of claim 1 wherein said electron beam source is modulated by a modulating means to form different beam currents for reading and writing and which forms in the target a field sufficiently large that a data bit is written by localized tunneling from the semiconductor into the dielectric, and which field, on reading, is not sufficient to cause tunneling into the dielectric.

18. The apparatus of claim 1 wherein said target area is defined along a pair of perpendicular dimensions to include multiple bit storage locations which data bit storage locations are in said dielectric and are isolated from one another by a distance which, in conjunction with the mobility of the charges in lateral movement within said dielectric, thereby defines isolated adjacent locations, there being an interface charge barrier between said semiconductor and said dielectric layer causing the surface at said semiconductor adjacent to said dielectric to accumulate charges where the extent of accumulation is increased in the area adjacent to data bit locations storing majority carriers.

19. The apparatus of claim 1 including a conductor affixed to said semiconductor opposite to said dielectric layer to define a Schottky diode thereat which functions as a Schottky output diode for the multitude of bit locations which diode forms output signals from carriers created in said semiconductor by said electron beam.

20. The apparatus of claim 19 including a suitable bias voltage and terminal for applying a reverse bias across said Schottky diode producing a region depleted of carriers extending into said semiconductor, a field across said depletion region and means for modulating the voltage between a read and a write condition.

21. The apparatus of claim 19 wherein said semiconductor layer is made thin such that its dimension between the Schottky diode depletion region edge in said semiconductor and the interface charge between said semiconductor and overlying dielectric is less than the separation of bit storage areas such that, when reading stored information, charges created in said semiconductor not recombining at said interface will be captured by the field of said diode rather than said charges diffusing to and recombining at neighboring attractive storage location interfaces.

22. The apparatus of claim 21, wherein charges created in said semiconductor during reading which are captured by the field of the Schottky diode and thereby contribute to the diode output current are an indication of a stored logic zero, and, contrariwise, said charges that recombine at said interface and decrease said diode output current are an indication of a stored logic one.

23. For use with an electron beam accessed storage device, a solid state memory therefore which is formed of generally coplanar and coterminous layers which layers are respectively a conductor, a semiconductor, a first dielectric, a second dielectric, a conductor and an electron beam source positioned to direct an electron beam at the first named conductor layer which beam impinges on said solid state memory by passing through said first named conductor layer.

24. The apparatus of claim 23 wherein said first layer has a conductivity and density approximating that of aluminum, has a thickness in the range of about 200 to 300 angstroms, and which layer forms, in conjunction with said semiconductor layer, a Schottky diode.

25. The apparatus of claim 23 wherein said semiconductor layer is formed of silicon and has a resistivity in the range of about 0.2 to about 2.0 ohm per centimeter, and has a thickness in the range of about 1500 to 3000 angstroms.

26. The apparatus of claim 23 wherein said third layer is primarily a layer of silicon dioxide which is sufficient to prevent tunneling thereacross from the second to the fourth layer in the absence of a bias voltage of a selected magnitude, and which third layer is constructed and arranged to permit the localized tunneling of both electron and hole charges thereacross dependent on the bias voltage polarity.

27. The apparatus of claim 23, wherein said fourth layer is formed of silicon nitride having a thickness in the range of about 300 to about 500 angstroms.

* * * * *